United States Patent [19]

Bischoff et al.

[11] Patent Number: 5,157,778

[45] Date of Patent: Oct. 20, 1992

[54] METHOD AND APPARATUS FOR CIRCUIT SIMULATION USING PARALLEL PROCESSORS INCLUDING MEMORY ARRANGEMENTS AND MATRIX DECOMPOSITION SYNCHRONIZATION

[75] Inventors: Gabriel P. Bischoff, Marlboro; Steven S. Greenberg, Bolton, both of Mass.

[73] Assignee: Digital Equipment Corporation, Maynard, Mass.

[21] Appl. No.: 513,017

[22] Filed: Apr. 23, 1990

Related U.S. Application Data

[63] Continuation of Ser. No. 898,476, Aug. 20, 1986, abandoned.

[51] Int. Cl.⁵ .................. G06F 7/38; G06F 9/455; G06F 15/16
[52] U.S. Cl. .................. 395/500; 364/931.41; 364/966.1; 364/937.8; 364/933.8; 364/750.2; 364/DIG. 2; 395/800
[58] Field of Search ... 364/200 MS File, 900 MS File, 364/750.5; 395/800, 500

[56] References Cited

U.S. PATENT DOCUMENTS

| | | | |
|---|---|---|---|
| T915,008 | 10/1973 | Gustavson et al. | 364/300 |
| 3,629,843 | 12/1971 | Herbert | 364/300 |
| 3,903,399 | 9/1975 | Enns et al. | 364/300 |
| 4,621,339 | 10/1986 | Wagner et al. | 364/900 |
| 4,694,411 | 9/1987 | Burows | 364/578 |
| 4,694,416 | 9/1987 | Wheeler et al. | 364/736 |
| 4,823,258 | 4/1989 | Yamazaki | 364/200 |
| 4,862,347 | 8/1989 | Rudy | 364/200 |
| 4,888,682 | 12/1989 | Ngai et al. | 364/200 |

OTHER PUBLICATIONS

Jacob et al., "Direct-Method Circuit Simulation Using Multiprocessors", *Proceedings of the International Symposium on Circuits & Systems*, May 1986, pp. 170-173.

Yamamoto et al., "Vectorized LU Decomposition Algorithms for Large Scale Circuit Simulation", *IEEE Transactions on Computer Aided Design*, vol. Ead-4, No. 3, pp. 232-239, Jul. 1985.

Primary Examiner—Lawrence E. Anderson
Assistant Examiner—Ayni Mohamed
Attorney, Agent, or Firm—Fish & Richardson

[57] ABSTRACT

A digital data processing system including a plurality of processors processes a program in parallel to load process data into a two-dimensional matrix having a plurality of matrix entries. So that the processors will not have to synchronize loading of process data into particular locations in the matrix, the matrix has a third dimension defining a plurality of memory locations, with each series of locations along the third dimension being associated with one of the matrix entries. Each processor initially loads preliminary process data into a memory location along the third dimension. After that has been completed, each processor generates process data for an entry of the two-dimensional matrix from the preliminary process data in the locations along the third dimension related thereto. Since the processors separately load preliminary process data into different memory locations, along the third dimension, there is no conflict with accessing of memory locations among the various processors during generation of preliminary process data. Further, since the processors can separately generate process data for different matrix entries from the preliminary data, there is no conflict in accessing of the memory locations among the various processors during of the process data.

10 Claims, 2 Drawing Sheets

METHOD AND APPARATUS FOR CIRCUIT SIMULATION USING PARALLEL PROCESSORS INCLUDING MEMORY ARRANGEMENTS AND MATRIX DECOMPOSITION SYNCHRONIZATION

This is a continuation of co-pending application Ser. No. 06/898,476 filed on Aug. 20, 1986, now abandoned.

FIELD OF THE INVENTION

The field of the present invention relates to computer assisted circuit simulation employing parallel processing.

BACKGROUND AND SUMMARY OF THE INVENTION

In the field of LSI and VLSI circuits, increased circuit complexity and increased density of the devices on a single chip have resulted in an ever increasing need for computer aided circuit simulation, which is capable of carrying out the necessary circuit simulation in a reasonable period of time. Computer programs such as SPICE and ASTAP have been employed for such circuit simulation. However, these are proven to be less and less adequate as the circuits become more dense and more complex on a single chip.

A variety of algorithms for the efficient and accurate simulation of complex circuits have been proposed for example, Nagle, "SPICE2. A Computer Program to Simulate Semiconductor Circuits," University of California, Berkley, Memo No. ERL-M520, May 1985; Weeks, "Algorithms for ASTAP-A Network Analysis Program," IEEE Transactions on Circuit Theory, Volume CT-20, pp. 628-634, November 1983; Saleh, Kleckner and Newton, Iterated Timing Analysis and SPICE, Proceedings of the IEEE International Conference on Computer Aided Design, Santa Clara, CA., pp. 139-140, September 1983; White and Sagiovanni-Vincentelli, "Relax 2.1-A Waveform Relaxation Based Circuit Simulation Program," Proceedings, International Custom Integrated Circuits Conference, Rochester, NY, pp. 232-236, June 1984. Salkallah and Director, "An Activity Directed Circuit Simulation Algorithm," Proceedings IEEE Conference on Circuits and Computers, pp. 1032-1035, October 1980.

More recently the implementation of some of these algorithms has been suggested in a multi-processing environment. Circuit simulation algorithms based on iterative methods, such as Gauss-Jacobi, however, while easy to parallelize, usually have slow convergence rates unless some of the parallelization utility is sacrificed. Iterative methods, moreover, are not appropriate for tightly coupled circuits. The RELAX simulator lumps together tightly coupled nodes and solves the sub-networks using a direct method. Such partitioning algorithms also have to deal with conflicting constraints when convergence properties, processor number and load balancing among processors need to be taken into account.

It has also been suggested in the past, that parallel processing using a plurality of computers, or computers having a plurality of central processing units which operate in parallel with each other, and closely coupling the plurality of processors to a shared memory, is a solution to the increasingly complex problem of circuit simulation. One such solution is proposed in Jacob, Newton, and Pederson, "Direct-Method Circuit Simulation Using Multiprocessors," Proceedings of the International Symposium on Circuits and Systems, May 1986. Another such solution is proposed in White, "Parallelizing Circuit Simulation—A Combined Algorithmic and Specialized Hardware Approach, Proceedings of the ICCD, Rye, New York, 1985.

Each of these references, however, recognizes a significant drawback to the utilization of parallel processing for circuit simulation. Since the processors are sharing the same memory, and the processors are in parallel computing values for different circuit elements throughout the LSI or VLSI circuit, or some defined sub-portion of such circuit, the processors will quite often be solving for values at the same node within the circuit at the same time. Since the processing algorithms also typically involve iterative processes, which update values for a given node based on computations relating to circuit elements connected to the node, nd a memory location within the computer is used to store the values at ny given time for a particular node, the problem arises that the access to he shared memory must be strictly controlled. Otherwise, more than one processor may write information into a memory location corresponding to a articular node, at the same time another processor is attempting to read previously stored information related to that node or write new information elating to that node, based on its computations with respect to a different circuit element attached to the node.

The solution in the past has been to require special locking mechanisms within the programs controlling the multiple processors in order to prevent such occurrences. This in effect lengthens the total CPU processing time required, in that much time is spent waiting for the access to the particular memory location to be opened to another of the processing units operating in parallel, which desires to read or write information into the particular memory location. In fact, the proposed solution in the past has been to block write access to the entire matrix when one CPU is writing to the matrix.

The Jacob et al. paper, noted above, investigates the parallel implementation of a direct method circuit simulator using SPLICE, and using up to eight processors of a shared memory machine. An efficiency close to forty-five percent was reported. Much of the failure to achieve a higher percentage efficiency is the result of synchronization of the multiple processors in their access to common shared memory locations.

Parallelization employing such simulation programs as SPICE uses a list of circuit components and parameters, which may be constants or variables, for example, in the case of MOSFET transistors geometric parameters, currents, charges, capacitances, etc., which are then used to calculate the individual components or terms, the sum of which equals the value for each entry at a position in a matrix. The matrix is used to solve a number of simultaneous equations for the variables, for example, voltages, at each node within the circuit. The matrix typically consists of an X by X matrix with X approximately equal to the number of nodes in the circuit. Since the circuit elements are typically connected to at least two nodes, and may often be connected to more than two nodes, the parallelization techniques employed in the past suffer from the disability that the summation of the terms, in order to define the value at the matrix location for a given node, may be influenced by more than one circuit element, and the parallel processors may be computing the effect of two or more circuit elements on the same matrix node location at the same time. This results in the need for the use of some technique, for example, interlocks, to prevent simultaneous writing or reading of data by more than one processor into or from the memory location corresponding to the matrix location.

Once the matrix is loaded, it is known in the art, using SPICE, to solve the matrix using sparse matrix LU decomposition. Parallelization of the matrix solution phase is also important, and presents unique problems. For larger circuits, the CPU time needed for the matrix solution phase will dominate over that needed for the matrix load phase. Efficient parallelization schemes are known for full matrices, as is reported in Thomas, "Using the Butterfly to Solve Simultaneous Linear Equations", BBN Laboratories Memorandum, March 1985. However, sparse matrices are more difficult to decompose efficiently in parallel. The LU decomposition algorithm has a sequential dependency and the amount of concurrent work which can be done at each step, using SPICE, in a space matrix is small. Algorithms detecting the maximum parallelism at each step have been proposed for vectorized circuit simulation. Yamamoto and Takahashi, "Vectorized LU Decomposition Algorithms for Large Scale Circuit Simulation", IEEE Transactions on computer Aided Design, Vol. Cad-4, No. 3, pp. 232-239, July 1985. Algorithms based upon a pivot dependency graph and task queues have been proposed. Jacob et al., supra. The overhead associated with task queues makes the efficiency of these algorithms questionable.

Recognizing the need for an improved circuit simulation apparatus and method, it is a general object of present invention to provide a circuit simulation apparatus and method for simulating LSI and VLSI circuits which eliminates the costly synchronization requirements of the prior art and, in addition, more efficiently implements the LU decomposition in parallel using multiple processors.

A feature present invention relates to providing memory locations corresponding both to the matrix location and to a specific one of a plurality of terms which determine the ultimate value for the entry at the matrix location, and summing the terms from the plurality of memory locations corresponding to a matrix entry to define a single value for the matrix entry.

A further feature of the present invention relates to synchronizing the parallel processors during matrix decomposition by assigning a single processor to a given row within the matrix and setting a flag when the values in a row extending from a diagonal matrix element are ready for use.

The features of the present invention discussed above, are not intended to be all-inclusive but rather are representative of the features of the present invention in order to enable those skilled in the art to better appreciate the advance made over the art and to understand the invention. Other features will become more apparent upon reference to the detailed description of the preferred embodiment which is contained below and with reference to the figures of the drawing.

BRIEF DESCRIPTION OF THE DRAWING

Figure one a schematic representation of the prior art SPICE program and circuit simulation apparatus implementing that program;

Figure two is a schematic representation of a method and apparatus according to the present invention for generating the matrix for solution of simultaneous equations necessary for circuit simulation.

DETAILED DESCRIPTION OF THE PREFERRED EMBODIMENT

Figure 1:
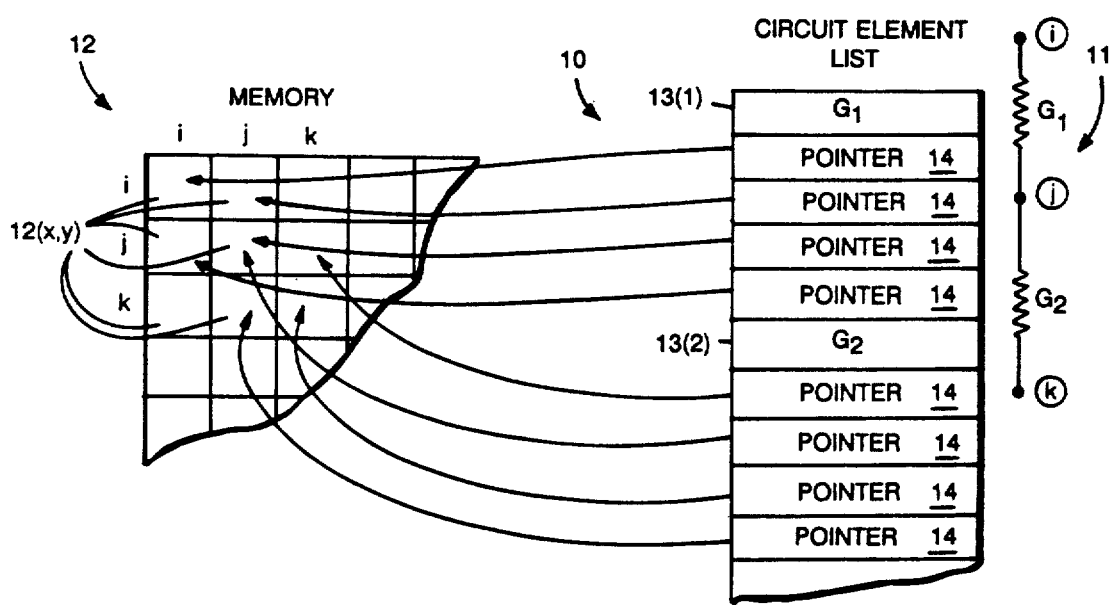
Figure 2:
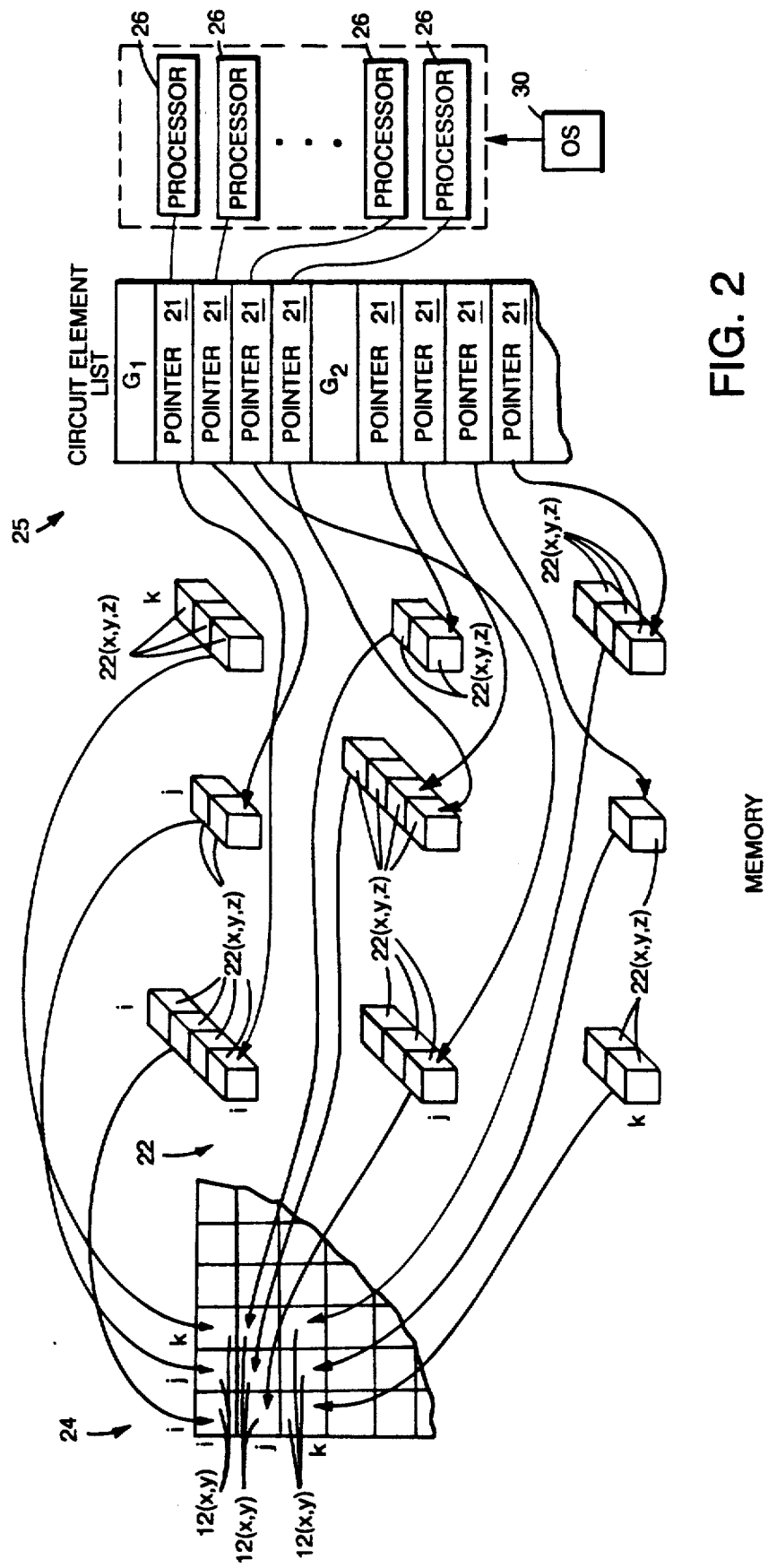

In the past, as shown in Figure one, representing the prior art, the parallelization of circuit simulation, for example, using SPICE, uses a list 10 of circuit elements 11 contained within the circuit, and a matrix 12, with the matrix locations 12a,y corresponding generally to the circuit nodes. Depending on the number of circuit elements connected to a node, and/or the type of circuit element connected to a node, a plurality of different terms can contribute to the ultimate value for the matrix location. The sum of these values is used in solving the simultaneous equations, in order to solve for the necessary variables to conduct the circuit simulation. With the SPICE program the use of parallel processors has been employed to analyze in parallel, different circuit elements and their contributions to the matrix values. However, the parallel processing of different circuit elements, each of which may contribute to different ones of the terms for the same matrix location entry, is not allowable in the past methods of parallel processing. This is so since, in the past, data representing the most recent value for the summation of all of the terms for a given matrix been stored in a single memory location, and summed with the values calculated for the next circuit element influencing the value of the sum of the terms for the given matrix location. Thus, in effect, each of the parallel processors must wait its turn to add its contributing term to sum the value for each matrix location entry.

As shown in Figure one, the list 10 of circuit elements contains the parameters 13C17, which determine the term or terms contained in the matrix location for a given matrix entry 12cx,y7, and a pointer 14, which points to the memory location for the given matrix entry 12a,y7. In actuality, using, e.g., the VAX11/780, the data is represented in a double precision value requiring eight bytes of data for each memory location.

The present invention employs a list of circuit elements 20, as shown in Figure two, essentially identical to the list employed by circuit simulators using SPICE. The list of circuit elements contains a plurality of pointers 21, each of which points to a memory location 22(x,y,z) within an array 22 of memory locations associated with a given matrix entry. There is, therefore, a memory location 22(x,y,z) assigned to each of the plurality of circuit elements which affects the sum of the terms for a given matrix entry. The input from one of the plurality of parallel processors operating on the calculation of the term for a given circuit element, which contributes to the total value for the given matrix entry will be stored in a designated memory location 22(x,y,z) and the input from another processor operating in parallel on the calculation of the contribution to the total value from a different circuit element will have a different designated memory location 22(x,y,z). The different memory locations correspond to the particular matrix entry by being included within an array of memory locations 22(x,y,z) corresponding to the given matrix entry, but each corresponds to a contribution from a different circuit element.

In effect, a three dimensional matrix of memory locations 22(xy,y,z) is established, with each matrix entry having a plurality of memory location 22(x,y,z) associated with it, each corresponding to a different circuit element, the influence of which determines a portion of the total value for each entry, which is employed in solving the simultaneous equations represented by the matrix.

Utilization of the present invention greatly speeds up the loading of the matrix entries for circuit simulation in order to solve the simultaneous equations. At present, the loading of the matrix entries, occupies approximately 80% of the total computing time necessary for circuit simulation. With the utilization of the present invention, including the improvement in the ability to parallelize the matrix loading portion of the operation, the efficiency of the circuit simulator's utilization of the plurality of parallel processors has been elevated to approximately 90%, as opposed to the 45% reported in the Jacob et al. paper noted above.

The present invention can be implemented on VAX8800 and 8300 computers manufactured by Digital Equipment Corporation which contain dual processors having a shared memory. In addition to defining the memory noted above, the parallelization program employing SPICE is divided into serial phases. Each phase is divided into tasks which are executed serially or concurrently. A phase whose task in executed serially is called a single stream phase whereas a phase whose tasks are executed concurrently is called a multiple stream phase. Single stream phases are executed by a master processor and the multiple stream phases are executed by slave processors. The slave processors are idle when the master is active and the master processor is idle when any of the slave processors is active. Processes are dynamically assigned to processors by the VAX VMS operating system (30). The VAX VMS operating system (30) also provides event flags (semaphores) used for synchronization between processors.

A general FORTRAN library has been designed for this environment. A program using this library has the following structure:

```
COMMON/LOCAL/LOCAL_VARIABLES
COMMON/SHARED/SHARED_VARIABLES
IF MASTER_PROCESS THEN
        CALL MASTER_CODE
ELSE
        CALL SLAVE_CODE
ENDIF
END
```

Master and Slave processes run the exact same executable file. In the above code MASTER_PROCESS is a logical function from the library. This library has presently seven entries and performs the following functions:

Initialization

This task is performed by the logical function MASTER_PROCESS. In consists of discriminating between a MASTER and SLAVE process, setting up the section of memory shared between the MASTER and SLAVE process, initializing the event flags used for synchronization in creating the slave process. This logical is set to TRUE if the process for executing the code is the master process and set to FALSE if it is the slave process.

Synchronization. This task is performed by four sub-routines. FORK, JOIN, JOIN_EXIT and JOIN_FORK. The sub-routine FORK is called by the master process in order to signal the slave process to proceed and then to wait for them to signal back. The sub-routine JOIN is called by the slave process in order to signal the master process to proceed and then to wait for it to call back. The sub-routine JOIN_EXIT is called by the slave process in order to signal the master process to proceed and then to exit. The sub-routine JOIN_FORK is called by the slave process in order to synchronize two multiple stream phases with no intervening single stream phase.

Interlock Memory Access. This task is performed by two sub-routines locked and unlocked. The variable used in the argument of sub-routines holds the state of the lock for the associated section of shared memory whose access needs to be interlocked. The sub-routine LOCK and UNLOCK use the atomic test and set instruction, BBSSI and BBCCI, of the VAX architecture.

The interlocks are necessary in certain sub-routines not related to the present invention, for example, synchronization routines and load balancing routines.

The tasks performed in parallel by the circuit simulation apparatus and method according to the present invention are matrix load, matrix LU decomposition and time step computation.

Those skilled in the art will appreciate that by employing the aspects of the present invention just described a number of advantages are achieved over the existing art. In SPICE, as it is known in the art, the matrix load phase for each circuit element includes evaluation and loading of the element's contribution to the matrix entry and the right-hand side of the simultaneous equations, as well as convergence checking of the branched currents. Element evaluation and convergence checking have no write contention in shared memory. However, the loading of the matrix and the right-hand side requires writing to memory locations which may be shared by several elements. Synchronization of write access to the matrix through a single lock on the whole matrix has been proposed by Jacob, et al., supra. In such a case only one processor can write into memory for the entire matrix at a given time. This leads to contention for shared resources and decreases efficiency.

In the present invention locking the entire matrix, or even some portion thereof, is avoided by the utilization of a memory structure which accommodates the storage of the individual contributions to a given matrix location entry from each of the circuit elements affecting that matrix location entry. The same list of circuit elements is used, as had been done in the past with SPICE. However, according to the present invention, the number of circuit elements attached to a given node is used to create an array of memory locations 22(x,y,z) associated with the node and the list of circuit elements is augmented by the incorporation of a pointer which directs the storage in a specific one of the array of memory locations of the term indicating the contribution of the particular circuit element to the total entry for the matrix location.

The memory structure so generated may be visualized as a three dimensional memory structure, with two dimensions defining the matrix locations and the third dimension defining the number of circuit elements affecting each matrix location. There is no unused memory in this structure since it has a variable depth in the third dimension.

After the list 20 of circuit elements is processed, and the memory locations 22(x,y,z) within each array 22 of memory locations thereby loaded with the terms ting contributions of the individual circuit elements to the total entry for the matrix location, the contents of the arrays are summed, again using parallel processing, without any contention for access to shared memory, in order to generate a single matrix for the computation of the solutions to the simultaneous equations for the circuit simulation.

Even distribution of tasks among the processors operating in parallel is achieved so that no slave process stays idle while others are computing. A dynamic task allocation is used for the multiple stream phase of matrix load. Since the time needed to load the factor contribution of each given circuit element cannot be estimated exactly, dynamic task allocation is used in lieu of static task allocation. Dynamic task allocation is achieved through an array of tasks whose number exceeds the number of processors. A task consists of a list of circuit elements to be loaded. Tasks are defined so that each requires approximately the same amount of work. The amount of work needed to load a circuit element is roughly estimated by neglecting bypass and evaluating the CPU time needed to load the given element. Dynamic task allocation minimizes any imbalance which may occur during simulation through device model computation bypass. Task allocation during the summing phase of the matrix load operation is done statically, since the work needed to perform this phase can be divided into tasks requiring roughly the same amount of CPU time. The only interlocked access to shared memory during the matrix load phase is the one required on the array index, which defines the next task when dynamic task allocation is employed. This index is successively read and incremented by all slave processors.

The present invention employs LU matrix decomposition mathematically similar to that performed by SPICE. When the LU decomposition requires pivoting, only a single master processor is used. This is done twice during transient analysis, for full pivoting, once for the first LU decomposition performed in the DC operating point computation and second for the first LU decomposition of the transient wave form computation. For all other decompositions, pivoting is used only relatively infrequently when a diagonal element used as a pivot is less than a predetermined threshold value.

During the time the parallel processing is being used for the LU decomposition, the present invention relates to synchronizing the parallel processors so that they will perform decomposition operations only on valid data. This is accomplished by assigning each slave processor a set of rows of the circuit matrix. When the SPICE decomposition algorithm progresses to a particular diagonal element, each processor updates the rows in its assigned set. The usual linked list of matrix entries below the diagonal is, according the present invention, broken down into separate lists based upon the rows assigned to each processor. A flag is associated with each diagonal element to ensure that it is never used before its final value is available. Use of this flag results in an efficient synchronization scheme. The flags are shared data accessed by multiple processors in the read mode, but only one in the write mode, so that no locks are needed.

This technique remains efficient for up to about four processors operating in parallel. Beyond this, optimum reordering and assignment of the rows may be necessary to improve the efficiency of the algorithm. The present invention makes use only of the existing SPICE version 2G5 reordering algorithm.

An heuristic algorithm assigns rows to the slave processors. The first step of this algorithm is to divide the circuit matrix into blocks of consecutive columns such that the slave processors can work within blocks without sychronization. The blocks found by scanning are found by scanning the set of matrix columns from left to right and assigning them to blocks so that within a block no dependency among diagonal elements exists when performing LU decomposition. Then in each block rows containing nonzero subdiagonal elements are assigned to slave processors by determining the number of updates necessary to complete a row and dividing the amount of work assigned to the slave processors during the LU decomposition so that it is balanced among them. For row assignment, the blocks are processed from right to left.

Parallelization of the time step computation does not present a major problem as the computation of the local truncation error for each energy storage element is independent. Each slave processor is assigned a set of energy storage elements and computes the minimum time step required by its set of energy storage elements. The master processor then computes the minimum time step among the time steps returned to it by the slave processors. The energy storage elements are assigned to the slave processors so that the work among them is balanced.

The preferred embodiment of the present invention has been described in order to comply with the requirements of the Patent Statutes, and is not intended to limit the present invention to any particular embodiment. Rather, those skilled in the art will appreciate that many modifications and changes may be made to the present invention without departing from the scope of the invention, and the inventors intend that the appended claims cover such changes and modifications as come within the scope and content of the appended claims.

What is claimed is:

1. In a digital data processing system including a plurality of processors which operate in parallel to produce a set of data results and store said data results in a corresponding set of entries in a memory shared by said processors, addresses of said set of entries being arranged so that the stored set of data results represents a two-dimensional matrix, a computer-implemented method for generating said data results comprising the computer-implemented steps of assigning multiple storage locations in said memory for at least some of said set of entries, generating with said processors a plurality of partial results to be used to format least some of said set of data results, and storing the partial results for a given data result in the multiple storage locations assigned to the entry that corresponds with said given data result, whereby multiple processors can access the memory simultaneously to store said partial results for said given data result, and generating with said processors said data results for said entries based on the partial results that have been stored in the multiple storage locations assigned to each said entry, and storing said data results in said set of entries.

2. The method of claim 1 wherein the step of generating said data results includes summing said partial results stored in said multiple storage locations assigned to at least one of said entries.

3. In a digital data processing system including a plurality of processors which operate in parallel to produce a set of data results and store said data results in a corresponding set of entries in a memory charted by said processors, addresses of said set of entries being arranged so that the stored set of data results represents a two-dimensional matrix in a first area of said memory, an arrangement for generating said data results comprising a second, working area of said memory that includes multiple storage locations assigned to at least some of said set of entries, said processors including:

means for generating a plurality of partial results to be used to format least some of said set of data results and for storing the partial results of a given data result in the multiple storage locations assigned to the entry that corresponds with said given data result, whereby multiple processors can access the memory simultaneously to store said partial results for said given data result, and means for generating said data results for said entries based on the partial results that have been stored in the multiple storage locations assigned to each said entry, and for storing said data results in said set of entries.

4. The system of claim 3 wherein said means for generating said data results includes means for summing said partial results stored in said multiple locations assigned to at least one of said entries.

5. In a digital data processing system including a plurality of processors and memory shared by the processors, a computer-implemented method for controlling said system to solve multivariable circuit equations for circuits having a plurality of nodes at least some of which have a plurality of circuit elements connected thereto, comprising the computer-implemented steps of establishing in said memory a set of entries the addresses of which are arranged so that the entries represent a two-dimensional matrix, each one of said entries corresponding to one of said nodes, assigning multiple storage locations in said memory for at least some of said set of entries, each one of said multiple storage locations for any entry corresponding to one circuit element connected to the node that corresponds to said entry, generating with said processors in parallel a plurality of partial results for said circuit elements, and storing the partial results in said memory such that the partial results for the circuit elements connected to a given node are stored in the multiple storage locations assigned to the entry corresponding to said node, whereby multiple processors can access the memory simultaneously to store the partial results for said entry, and generating with said processors data results for said nodes based on the partial results that have been stored in the multiple storage locations assigned to the respective entries that correspond with said nodes, and storing said data results in said set of entries.

6. The method of claim 5 wherein the step of generating said data results includes summing said partial results stored in said multiple locations assigned to at least one of said entries.

7. In a digital data processing system including a plurality of processors and a memory shared by the processors, an arrangement for controlling said system to solve multi-variable circuit equations for circuits having a plurality of nodes at least some of which have a plurality of circuit elements connected thereto, comprising a set of entries in a first area of said memory the addresses of which are arranged so that the entries represent a two-dimensional matrix, each one of said entries corresponding to one of said nodes, a second, working area of said memory that includes multiple storage locations assigned to at least some of said set of entries, each one of said multiple storage locations for an entry corresponding to one circuit element connected to the node that corresponds to said entry, said processors each including:

means for generating, in parallel with other said processors, a plurality of partial results for said circuit elements and for storing the partial results in said second area of memory such that the partial results for the circuit elements connected to a given node are stored in the multiple storage locations assigned to the entry that corresponds to said node, whereby multiple processors can access the memory simultaneously to store the partial results for said entry, and means for generating data results for said nodes based on the partial results that have been stored in the multiple storage locations assigned to the respective entries that correspond to said nodes, and storing said data results in said set of entries.

8. The system of claim 7 wherein said means for generating said data results includes means for summing said partial results stored in said multiple locations assigned to at least one of said entries.

9. In a digital data processing system including a plurality of processors which operate in parallel to produce a set of data results and store said data results in a memory shared by said processors, a computer-implemented method comprising the computer-implemented steps of generating with said processors multiple partial results for at least some of the set of data results, and storing said partial results in corresponding to multiple storage locations in said memory such that multiple processors can access the memory simultaneously to store their partial results, enabling said processors to generate said set of data results based other partial results that have been stored in said memory and to store said data results in a set of entries in said memory, said set of entries having addresses that correspond to each other so that the stored set of data results represents a two-dimensional matrix, and processing, with at least one of said processors, said data results to solve a plurality of multi-variable equations represented by said matrix.

10. In a digital data processing system including a plurality of processors which operate in parallel to produce a set of data results and store said data results in a memory shared by said processors, an arrangement comprising means for generating multiple partial result with said processors for at least some of the set of data results and storing said partial results in corresponding multiple storage locations in said memory such that multiple processors can access the memory simultaneously to store their partial results, means for enabling said processors to generate said set of data results based on the partial results that have been stored in said memory and to store said data results in a set of entries in said memory, said set of entries having addresses that are arranged so that the stored set of data results represents a two-dimensional matrix, and means for processing said data results with at least one of said processors to solve a plurality of multi-variable equations represented by said matrix.

* * * * *

UNITED STATES PATENT AND TRADEMARK OFFICE
CERTIFICATE OF CORRECTION

PATENT NO. : 5,157,778

DATED : October 20, 1992

INVENTOR(S) : Bishoff et al.

It is certified that error appears in the above-identified patent and that said Letters Patent is hereby corrected as shown below:

On the title page:
Under References Cited: add "4,725,970 2/1988 Burrows et al. 364/578.

Column 2, line 18, "nd" should be --and--.

Column 2, line 20, "ny" should be --any--.

Column 2, line 21, "he" should be --the--.

Column 2, line 24, "articular" should be --particular--.

Column 2, line 27, "elating" should be --relating--.

Column 4, line 10, "12a;y" should be 12(x,y)--.

Column 4, line 27, insert --12(x,y) after "location".

Column 4, line 35, "13C17" should be --13(i)--.

Column 4, line 37, "12cx,y7" should be 12(x,y)--.

Column 4, line 45, insert --20-- after --elements--.

Column 4, line 48, insert --24(x,y) in the matrix 24-- after "entry".

Column 4, line 51, insert --24(x,y)-- after "entry--.

Column 4, line 52, insert --26-- after "processors".

Column 4, line 55, insert --24-- after "entry--.

Column 4, line 56, "insert --26-- after "processor--.

UNITED STATES PATENT AND TRADEMARK OFFICE
CERTIFICATE OF CORRECTION

PATENT NO. : 5,157,778
DATED : October 20, 1992
INVENTOR(S) : Bishoff et al.

It is certified that error appears in the above-identified patent and that said Letters Patent is hereby corrected as shown below:

Column 4, line 60, insert --22 (x,y,z)-- after "locations--.

Column 4, line 61, insert --22-- after "array".

Column 4, line 63, insert --24 (x,y,z)-- after "entry".

Column 4, line 66, insert --24 (x,y,z)-- after "entry".

Column 5, line 2, insert --24 (x,y)-- after "entry".

Column 5, line 4, insert --24-- after "matrix".

Column 6, line 68, "ting" should be --representing--.

Column 8, line 53 "format" should be --form at--.

Signed and Sealed this

Thirtieth Day of May, 1995

Attest:

Attesting Officer

BRUCE LEHMAN
Commissioner of Patents and Trademarks